United States Patent
Laermer et al.

(10) Patent No.: US 6,284,148 B1
(45) Date of Patent: Sep. 4, 2001

(54) METHOD FOR ANISOTROPIC ETCHING OF SILICON

(75) Inventors: Franz Laermer, Stuttgart; Andrea Schilp, Schwaebisch Gmuend, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/284,914

(22) PCT Filed: Aug. 19, 1998

(86) PCT No.: PCT/DE98/02406

§ 371 Date: Jul. 16, 1999

§ 102(e) Date: Jul. 16, 1999

(87) PCT Pub. No.: WO99/10922

PCT Pub. Date: Mar. 4, 1999

(30) Foreign Application Priority Data

Aug. 21, 1997 (DE) .............................. 197 36 370

(51) Int. Cl.⁷ .............................. B44C 1/22; H01L 21/00; C25F 3/12
(52) U.S. Cl. .............................. 216/37; 438/694; 438/733
(58) Field of Search .............................. 216/37; 438/694, 438/733

(56) References Cited

U.S. PATENT DOCUMENTS

| 4,795,529 | | 1/1989 | Kawasaki et al. . | |
| 4,985,114 | * | 1/1991 | Okudaira et al. | 216/37 |
| 5,474,650 | | 12/1995 | Kumihashi et al. . | |
| 5,498,312 | * | 3/1996 | Laermer et al. | 216/37 |
| 5,501,893 | * | 3/1996 | Laermer et al. | 426/161 |
| 5,618,379 | * | 4/1997 | Armacost et al. | 438/595 |
| 6,051,503 | * | 4/2000 | Bhardwaj et al. | 438/705 |

FOREIGN PATENT DOCUMENTS

| 42 41 045 | 5/1994 | (DE) . |
| 44 20 962 | 12/1995 | (DE) . |
| 363 982 | 4/1990 | (EP) . |
| 822 582 | 2/1998 | (EP) . |
| 63-043321 | 2/1988 | (JP) . |
| WO 94 14187 | 6/1994 | (WO) . |

* cited by examiner

Primary Examiner—Randy Gulakowski
Assistant Examiner—Shamim Ahmed
(74) Attorney, Agent, or Firm—Kenyon & Kenyon

(57) ABSTRACT

A method is proposed for anisotropic etching of micro- and nanofeatures in silicon substrates using independently controlled etching steps and polymer deposition steps which succeed one another alternatingly, the quantity of polymer deposited decreasing in the course of the polymer deposition steps, thus preventing any underetching of the micro- and nanofeatures.

9 Claims, No Drawings

METHOD FOR ANISOTROPIC ETCHING OF SILICON

FIELD OF THE INVENTION

The present invention relates to a method for anisotropic etching of silicon.

BACKGROUND INFORMATION

It is known to etch defined features, for example trenches, combs, tongues, flexural beams, or the like, anisotropically with low to medium selectivity into silicon substrates that are preferably utilized with the semiconductor technique. The individual features to be etched in are usually defined by way of etching masks applied onto the silicon substrate, via so-called masking layers, for example a photoresist layer. In the anisotropic etching technique it is necessary to arrive at exactly laterally defined recess in the silicon. These recesses, penetrating in the depth direction, must possess lateral boundaries which are as accurately perpendicular as possible. The edges of the masking layers which cover those silicon substrate regions that are not to be etched must not be underetched, so as to maximize the lateral accuracy of the feature transfer from the mask into the silicon. This results in the need to have etching proceed only on the nature floor, and not on the previously created sidewalls of the features. It is proposed in German Patent 42 41 045 to perform the etching of profiles into silicon substrates using a method which alternatingly provides plasma polymer deposition and plasma etching steps. In this context, deposition and etching steps are performed in a chemical context based exclusively on fluorine compounds; during the inherently isotropic etching steps, forward advancement of the sidewall polymer film applied during the previous deposition steps already effectively passivates the freshly exposed portions of the silicon sidewall, so that the inherently isotropic etching step becomes locally highly anisotropic. This technique of local anisotropy by way of forward advancement of a sidewall film allows relatively wide etching steps at very high speed without etching into the sidewall, which consequently exhibits only minor roughness. In general, the performance of this plasma etching, when it is done with microwave excitation (propagation ion etching or PIE), does not create any appreciable wall roughess. This process does, however, create serious problems in a so-called inductively coupled system with high-frequency plasma excitation (ICP= inductively coupled plasma). With this, a pronounced recess becomes etched into the silicon directly beneath the edge of the photoresist mask. This recess is an effect of the inductive excitation, which is associated with magnetic and electric fields in the region of the substrate, for example a silicon wafer, and appears with greater or lesser severity on ICP systems of various designs. Inductively coupled plasma systems are playing an increasingly important role because of their robustness and versatility, and are inherently well suited for the process described above. A factor playing a major role in the formation of the etching recesses is the fact that the transition region between photoresist mask and silicon represents a discontinuity in conjunction with electric fields of the plasma source, and is exposed to a greater ion bombardment than the lower portion of the sidewall. In addition, the mechanism of the advancing sidewall film is not yet completely effective at the mask edge, and passivation of the sidewall there is thus weaker. This results in the so-called underetching, so that the etched-in silicon features no longer exhibit the necessary accuracy and critical dimensions.

SUMMARY OF THE INVENTION

The method according to the present invention for anisotropic etching in silicon avoids the problems of underetching in previously conventional ICP etching processes by the fact that the quantity of polymer deposited in the course of the polymer deposition steps which are accomplished alternatingly with the etching steps is initially too great, and then gradually decreases. The shortage of sidewall polymer at the beginning of the process is thus remedied by an excess of polymer, so that the sidewall remains sufficiently passivated. The greater ion bombardment at the discontinuity point now also no longer results in any etching of the critical region. It is thus an essential feature and a particular advantage of the process that it operates first with an excess of polymer, and that this excess then decreases in the course of the alternating polymer deposition and etching steps. The disadvantages of an excess deposition of polymer that have occurred hitherto include the occurrence of so-called positive-slope profiles, i.e. the sidewall of the etched trench is no longer perpendicular, but rather tapers with increasing etching depth, until a pointed tip occurs. A correction made, for example, only once to this profile by way of suitable process parameters results once again in the recess problem at the transitional discontinuity point. This also is eliminated by the gradual reduction in deposited polymer in the course of the polymer deposition steps. The so-called initially over-rich process with a positive profile begins with no recess formation, so that the process transitions gradually to one which generates perpendicular profiles with less polymer deposition, and the greater part of the etching operation is performed therewith.

Advantageous embodiments and developments of the method.

In a particularly advantageous embodiment of the method according to the present invention, adjustment of the polymer deposition steps is performed continuously from one process cycle to the next. It is advantageous to begin with a so-called "rich" (i.e. high-polymer) process parameter set, which would result in a positive profile but definitely prevents any recess formation beneath the mask edge. With each of the following cycles the polymer concentration in the process is then slightly scaled back, so that this continuous adjustment of various process parameters minimizes both discontinuities in the profile transitions and the risk of forming a recess. Advantageously, adjustment of the parameter set is accomplished over the first 20 μm of etching depth if, for example, etching is to occur to a depth of 100 μm into silicon.

In a further advantageous development of the method according to the invention, present the quantity of deposited polymer decreases in discrete steps. The process begins, for example, with a long deposition time for each step, and etching is performed for a while with that parameter set; the deposition time is then reduced, etching continues for a certain period with the new parameter set, and so on until a parameter set generating a vertical profile has been arrived at.

Advantageously, it is possible to control the decrease in polymer quantity by varying the duration of the etching steps or the polymer deposition steps, since no internal plasma properties change when the duration of the individual steps is changed. Varying the duration of the etching step or the polymer deposition step is simple, and the effects of modification are readily apparent.

A further preferred possibility is to control the polymer quantity by varying the substrate temperature, or to change the pressure during deposition. It is important to note in this context that a sudden transition from a parameter set generating a positive profile to a much less positive one also creates the risk of recess formation: when a transition is made to a perpendicular profile, if it occurs suddenly, the positive profile is very similar in shape to the profile of the resist mask edge (or of the $SiO_2$ mask edge, if a hard-material mask is being used), and the transition to a less-positive profile shape once again constitutes a definite and significant discontinuity in the sidewall, which once again can cause problems with recess formation in ICP systems. It is therefore advantageous not to perform this adjustment in very large steps, but to transition to a vertical parameter set in several steps. It is advantageous in particular if etching is first performed for a certain distance with the positive parameter set before transitioning to a less-positive or vertical one, since the sidewall already generated acts as a polymer deposit, and the more extensive that polymer deposit already is, the better the sidewall film transport mechanism functions. In practice, for example, it is possible to make this adjustment in three parameter steps each with an etching width of 10 $\mu$m, and then to continue etching with a vertical parameter set, for example if etching is to proceed to a total depth of 100 $\mu$m in silicon. It is also possible to etch nanofeatures on the silicon, i.e., make the adjustment in parameter steps each having an etching width in the order of nanometers.

In a further particularly advantageous embodiment of the method, all the parameters are continuously adjusted. Etching begins with a rich (i.e. high-polymer) process parameter set which would result in a positive profile but definitely prevents recess formation beneath the mask edge. With each of the following cycles, one of the influencing parameters, for example the polymer deposition time, duration of the etching steps, substrate temperature, or pressure, is changed accordingly. This continuous adjustment of the entire parameter set also minimizes both discontinuities in the profile transitions and thus the risk of forming recesses.

In practice, the overall result of each of the advantageous embodiments of the method according to the present invention is a vertical etching profile, even though the process begins with an initially positively sloped, tapering profile and transitions gradually to a vertical etching profile. The reason for this is that the positive profile portion in a vertically etching process is protected only by the sidewall polymer, and no longer by the mask, since the tapering positive profile projects beyond the mask edge into the trench, and the sloping sidewall is exposed to a more severe ion bombardment than an already vertical sidewall. The vertically etching process thus slowly removes the projecting portion of the overall profile, and this deviation from the vertical profile shape therefore corrects itself automatically. The only prerequisite for this is that after the transition to the vertical-etching process parameter set, whether in discrete steps or continuously in the manner described, etching is continued for a sufficiently long time for this profile correction to occur completely. The values indicated, namely 10 to 20 $\mu$m for the initialization steps and then approximately 80 $\mu$m over which etching takes place with the vertically etching process, represent a rough guideline for process design. Different etching depths greater than 100 $\mu$m can, of course, also be achieved with this strategy.

The method according to the present invention can be used, for example, to etch isolated vertical silicon webs only 1 $\mu$m wide by 40 $\mu$m deep, with no feature loss. It is possible with this technique to produce features which have an aspect ratio, i.e. the ratio of depth to feature width, of 100:1 to 200:1. The etching rate in this context reaches values of 5 $\mu$m/min and more, and mask selectivity attains values of 100:1 (photoresist) or 200:1 ($SiO_2$). Features of this kind were hitherto possible to manufacture only with the LIGA technique (synchrotron illumination in PMMA), laboriously and at great expense.

DETAILED DESCRIPTION

In an etching chamber or in another suitable reaction vessel, a correspondingly prepared silicon substrate—i.e. a silicon substrate coated with an etching mask made, for example, of photoresist, the etching mask leaving exposed the region of the silicon substrate which is to be anisotropically etched into—is exposed to a first polymer deposition step in order to apply a polymer deposit onto the mask edges. There then follows a first etching step, which immediately "feeds" on the applied polymer deposit and thus etches almost purely anisotropically. It is essential for the method according to the present invention that the first step be a polymer deposition step, so that the sidewall protection mechanism functions during the subsequent etching step. Further polymer deposition and etching steps are then accomplished alternatingly. The method according to the present invention can of course also be performed with an analogous apparatus that accomplishes the individual process steps. A mixture of, for example, $SF_6$ and Ar, which exhibits a gas flow of between 0 and 200 standard cu3 /min and a process pressure of between 10 and 100 $\mu$bar, is used in this method. Plasma generation is accomplished in this connection preferably with microwave irradiation at power levels between 300 and 1200 W (2.45 GHz), or by high-frequency irradiation at power levels of 500 to 2000 W, in an ICP source which is especially preferred for the method according to the present invention. At the same time, a substrate bias voltage is applied to the substrate electrode to accelerate the ions. The substrate bias voltage is preferably between 35 and 70 V, and can be achieved with a high-frequency feed (13.56 megahertz) at power levels between 2 and 10 W.

The first polymer deposition step, and of course also those which cyclically follow it, is performed with a mixture of, for example, $CHF_3$ (trifluoromethane) and Ar. Advantageously, however, it is also possible to use other fluorine-containing gases instead of trifluoromethane, for example octafluorocyclobutane (Freon C 318), hexafluoropropene (HFP, Hoechst) or its dimers, or tetrafluoroethene (TFE). It is also possible to perform the process without argon. The mixture possesses a gas flow of preferably 0 to 200 standard $cm^3$/min and a process pressure of between 10 and 100 $\mu$bar. In a preferred embodiment of the method according to the present invention, octafluorocyclobutane or hexafluoropropene is used, since these compounds exhibit particularly good polymerization properties under ICP excitation. During the polymer deposition step, the exposed surfaces, i.e. the etching floor and the side surfaces, are covered very uniformly with a polymer. This polymer layer on the edges and surfaces of the etching mask forms a highly effective temporary etch protectant. The polymer layer applied onto the etching floor during the polymerization step is rapidly broken through during the subsequent etching step, since the polymer is very quickly removed with ion assistance, and the chemical conversion of the reactive plasma species with the silicon on the etching floor can proceed. The sidewalls of the features being etched remain protected during the etching step by the sidewall polymer applied during the previous polymer deposition step or steps.

During the first etching step which then follows, chemically reactive species and electrically charged particles are generated in the mixture of $SF_6$ and Ar in the reactor with the aid of an electrical discharge. The positively charged cations generated in this fashion are accelerated toward the silicon substrate by the electrical bias voltage applied to the substrate electrode, and are incident approximately perpendicularly onto the substrate surface left exposed by the etching mask and promote chemical reaction of the reactive plasma species with the silicon. They also ensure polymer film transport in the depth direction of the etched trench; this is the consequence in particular of that portion of the ions which is not incident absolutely perpendicularly, and strikes the sidewalls. The etching step can be performed until the desired etching depth has been attained. This is then followed by another polymer deposition step, although this time less polymer is deposited than the first time. The etching steps and polymerization steps are repeated alternatingly, with appropriate adjustments in the process parameters, enough times for the quantity of deposited polymer gradually to decrease. These process parameters comprise the physical quantities listed below:

1. Elevation in ICP power level, for example to >1000 W, with simultaneous increase in the flow of passivation gas, for example $C_4F_8$, $C_3F_6$, $(C_3F_6)_2$, $CHF_3$, to, for example, >200 sccm (sccm=standard $cm^3$/min=$cm^3$/min at 1 bar), which results in enhanced polymer deposition.
2. Increase in the duration of deposition steps, which also results in enhanced polymer deposition.
3. Decrease in the duration of the etching steps, which effectively increases passivation of the sidewalls.
4. Reduction in wafer temperature, which also increases polymer deposition.
5. Performing the deposition steps in the pressure region most favorable for polymer deposition in ICP systems, i.e. around 10 $\mu$bar; and
6. Elevating the pressure during the etching steps to 20 to 30 $\mu$bar in order to increase the etching radical concentration but decrease the concentration of ions which remove the polymer.

What is claimed is:

1. A method for anisotropically etching microfeatures and nanofeatures, comprising the steps of:

depositing a quantity of a polymer on a silicon substrate;

etching the microfeatures and the nanofeatures on the silicon substrate; and independently controlling and repeating the etching step and the polymer deposition step in an alternating fashion;

wherein the quantity of the polymer deposited during the polymer deposition step is decreased in a controlled manner with the repetition of the polymer deposition step.

2. The method according to claim 1, wherein the polymer deposition step is a first step in the method.

3. The method according to claim 1, wherein the polymer quantity is decreased continuously.

4. The method according to claim 1, wherein the polymer quantity is decreased in discrete steps.

5. The method according to claim 1, further comprising the step of:

controlling a decrease of the polymer quantity by varying a polymer deposition time.

6. The method according to claim 1, further comprising the step of:

controlling a decrease of the polymer quantity by varying a time duration of the etching step.

7. The method according to claim 1, further comprising the step of:

controlling a decrease of the polymer quantity by varying a temperature of the silicon substrate.

8. The method according to claim 1, further comprising the step of:

controlling a decrease of the polymer quantity by varying a pressure.

9. The method according to claim 1, further comprising the step of:

controlling a decrease of the polymer quantity by at least one of a polymer deposition time, a time duration of the etching step, a temperature variation of the silicon substrate and a pressure variation.

* * * * *